(12) United States Patent
Lin et al.

(10) Patent No.: US 6,225,209 B1
(45) Date of Patent: *May 1, 2001

(54) METHOD OF FABRICATING CRACK RESISTANT INTER-LAYER DIELECTRIC FOR A SALICIDE PROCESS

(75) Inventors: Yei-Hsiung Lin, Hsinchu; Chih-Chun Huang, Taichung; Chen-Bin Lin, Taipei; Cheng-Hui Chung, Hsinchu Hsien, all of (TW)

(73) Assignee: United Microelectronics Corp., Hsinchu (TW)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/150,525

(22) Filed: Sep. 10, 1998

(30) Foreign Application Priority Data

May 16, 1998 (TW) .................................................. 87107637
Jul. 18, 1998 (TW) .................................................. 87111750

(51) Int. Cl.[7] .............................................. H01L 21/4763

(52) U.S. Cl. ........................... 438/624; 438/627; 438/626; 438/632

(58) Field of Search .................................... 438/473, 474, 438/471, 477, 782, 783, 624, 697, 623, 619, 622, 633, 631, 626, 632; 257/530, 533, 529, 50

(56) References Cited

U.S. PATENT DOCUMENTS

| 5,328,553 | * | 7/1994 | Poon ..................................... 156/636 |
| 5,444,026 | * | 8/1995 | Kim et al. ............................. 437/240 |
| 5,552,627 | * | 9/1996 | McCollum et al. .................. 257/530 |
| 5,589,412 | * | 12/1996 | Iranmanesh et al. .................. 437/43 |
| 5,747,381 | * | 5/1998 | Wu et al. .............................. 438/624 |
| 5,770,885 | * | 6/1998 | McCollum ............................ 257/530 |
| 5,814,545 | * | 9/1998 | Seddon et al. ........................ 438/303 |
| 5,847,464 | * | 12/1998 | Singh et al. .......................... 257/752 |
| 5,872,390 | * | 11/1999 | Lee et al. .............................. 257/529 |
| 5,960,311 | * | 9/1999 | Singh et al. .......................... 438/623 |
| 5,989,983 | * | 11/1999 | Lee et al. .............................. 438/473 |

* cited by examiner

Primary Examiner—Chandra Chaudhari
Assistant Examiner—Laura Schillinger
(74) Attorney, Agent, or Firm—Thomas, Kayden, Horstemeyer & Risley

(57) ABSTRACT

A method for fabricating a crack resistant inter-layer dielectric for a salicide process. The method includes forming an insulating layer on a provided substrate, forming a planarized inter-layer dielectric layer on the insulating layer, and performing a short-duration thermal treatment to increase the density of the inter-layer dielectric layer.

6 Claims, 2 Drawing Sheets

METHOD OF FABRICATING CRACK RESISTANT INTER-LAYER DIELECTRIC FOR A SALICIDE PROCESS

CROSS-REFERENCE TO RELATED APPLICATION

This application claims the priority benefit of Taiwan application serial no. 87107637, filed May 16, 1998, the full disclosure of which is incorporated herein by reference.

BACKGROUND OF THE INVENTION

1. Field of the Invention:

This invention relates to a method of fabricating an inter-layer dielectric (ILD) for a salicide process, and more particularly, to a method of fabricating a crack resistant ILD for a salicide process.

2. Description of Related Art:

Because of semiconductor device line width and pattern downsizing, the conductivity of the polysilicon gate of a metal-oxide-semiconductor (MOS) device and the wiring line of a semiconductor device is lowered. A gate includes one or more metal or salicide layers formed on top of a polysilicon layer. Compared with a gate containing only polysilicon, the foregoing gate has a lower resistance. A salicide gate is fabricated by forming a salicide layer, such as a titanic silicide, with a thickness of about 1000Å, to cover a polysilicon layer, with a thickness of about 1000 to 3000Å, wherein the salicide layer provides a horizontal conducting path with a lower resistance above the gate.

Because the existence of an ILD layer is to prevent an electric short circuit between the gate and the metal layer, which is formed by a follow-up sputtering process, normally, a relatively thick insulating layer is formed on the gate, to be used as an ILD layer after the gate is formed, to insulate both the gate and the metal layer. After the formation of the ILD layer, the follow-up patterning process is performed to form the contact hole.

FIGS. 1A through 1C are sectional views showing a conventional method of fabricating a crack resistant ILD for a salicide process. Referring to FIG. 1A, gate oxide 102 and polysilicon layers 104a and 104b, which are used as gates, are formed on the substrate 100. Then, before the formation of spacer 106, a light ion implantation is performed on the substrate 100. After the spacers 106 are formed on the sides of the gate 104a and 104b, heavy ion implantation is performed on the substrate 100 to form lightly doped drain (LDD) regions 108. A thermal process is performed to form a titanium layer on the substrate 100. This titanium layer reacts with the substrate 100 and the polysilicon used as gates 104a and 104b, to form titanium silicide 110a and 110b on the lightly doped drain regions 108, and gates 104a and 104b. A insulating layer 112, such as a non-doped silicon oxide layer, is formed on the substrate 100 to cover the gates 104a and 104b, and the substrate 100 after the rest of the titanium layer is removed from the substrate 100.

Referring to FIG. 1B, an ILD layer is formed on the substrate 100, wherein the formation of the ILD layer includes first forming a borophosphosilicate glass (BPSG) layer 114a on the insulating layer 112. This is followed by forming a spin-on glass (SOG) layer 114b on the BPSG layer 114a, and performing a chemical-mechanical polishing process. The SOG layer is used to fill the dish locations and holes on the surface of the BPSG layer to improve planarity. Then, a patterning process is performed form a contact hole 116 which is electrically connected to the lightly doped regions 108.

Because natural oxide is formed on the bottom surface of the contact hole 116, an extra process for removing the native oxide using chemical etching liquid is required before the metal sputtering process is carried out. However, the ILD layer 114a and insulating layer 112 are very easily damaged by the chemical etching liquid. Once the ILD layer 114a is damaged by the chemical etching liquid, the chemical etching liquid further damages the insulating layer 112 and the spacers 106 through the cracks 120 within the ILD layer 114a. As a result, the metal layer 118, which fills the contact hole 116 in the follow-up fabrication process also fills the cracks 120, creating bridges between gates 104a and 104b, which cause short circuits and abnormal currents.

SUMMARY OF THE INVENTION

It is therefore an objective of the present invention to provide a method for fabricating a denser ILD layer to prevent damage to the ILD layer caused by chemical etching liquid. This will in turn prohibit the formation of bridges between the polysilicon layers, and current leakage can be eliminated.

In accordance with the foregoing and other objectives of the present invention, the invention provides a method of fabricating a crack resistant—ILD for a salicide process. The method includes forming source/drain regions on the sides of a gate of a provided substrate, forming a salicide layer on the gate, and on the source/drain regions, and forming first an insulating layer and then a planarized ILD layer on the substrate. The ILD layer includes a BPSG layer and a SOG layer. A thermal process is then performed on the ILD layer to form a denser ILD layer, which is more resistant to undesired etching.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENTS

Figure 1A:
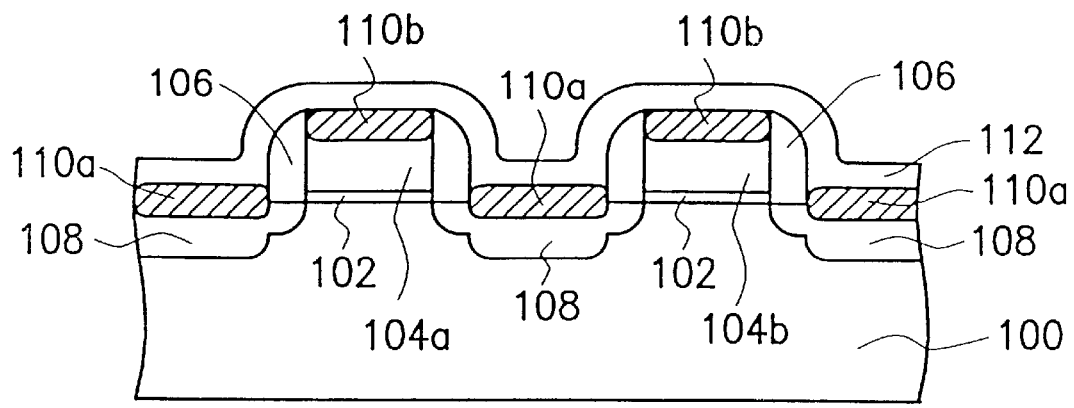
FIGS. 1A through 1C are sectional views showing a conventional method of fabricating a crack resistant—ILD for a salicide process.
Figure 1B:
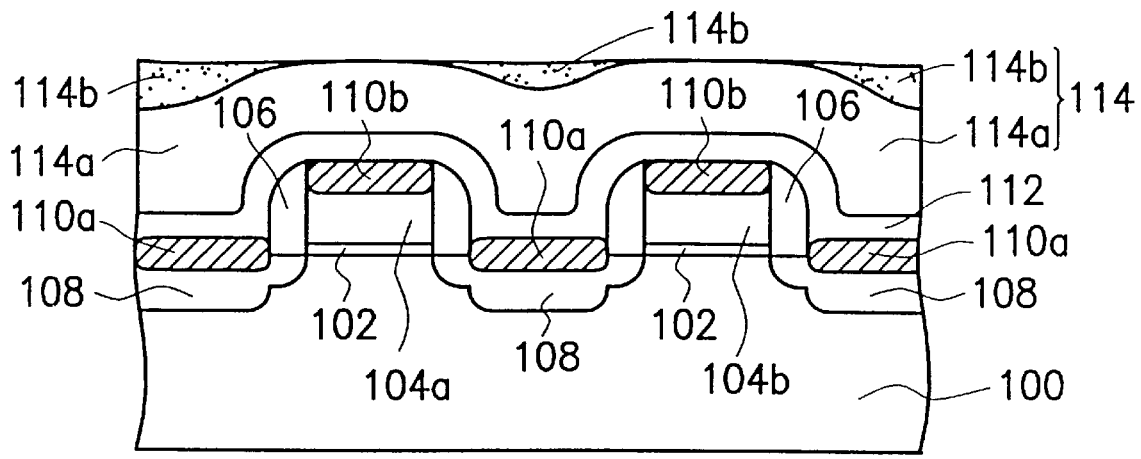
Figure 1C:
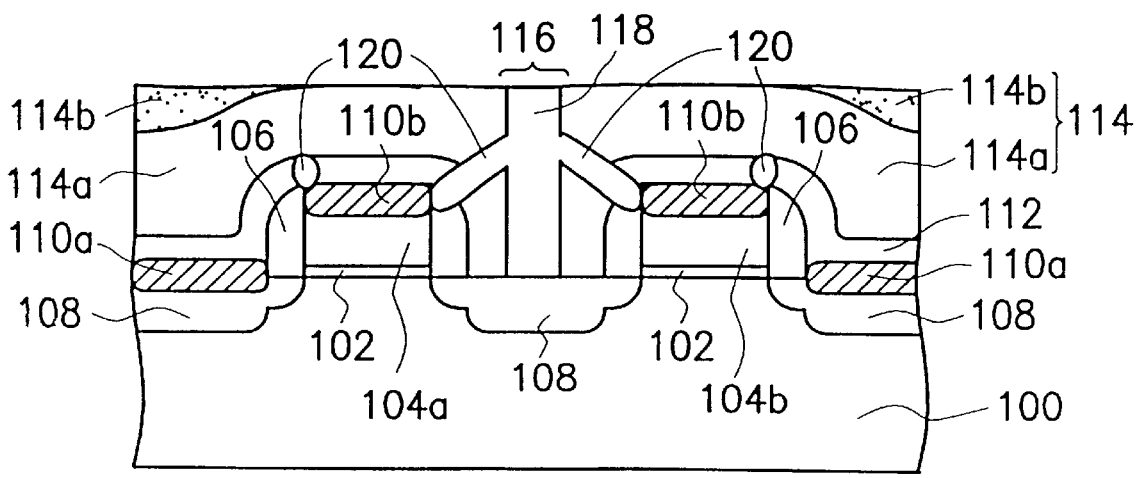
Figure 2A:
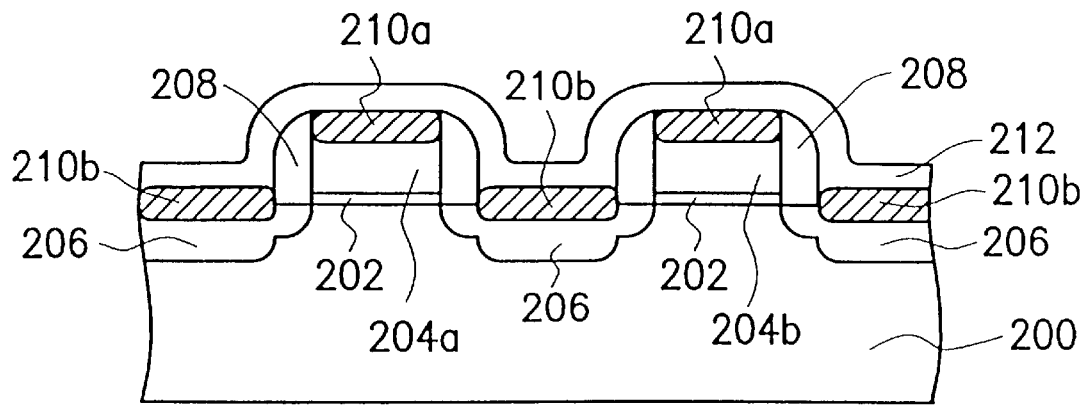
FIGS. 2A through 2C are sectional views showing a method of fabricating a crack resistant ILD for a salicide process in a preferred embodiment according to the invention.

The invention provides a new method of fabricating a crack resistant ILD for a salicide process. Referring to FIG. 2A, a MOS device is formed on a p-type substrate 200, which further includes insulating region, such as field oxide or shallow trench isolation, (not shown) for separating component devices. A gate oxide layer 202 is formed by performing a thermal oxidation process on an active area between isolation areas, and then, gates 204a and 204b of polysilicon are formed on the gate oxide layer 202. Normally, gates 204a and 204b are formed by first depositing a non-doped polysilicon layer over the substrate 200 through low pressure chemical vapor deposition (LPCVD), performing an implantation process on the polysilicon layer, and then, performing an anneal process on the polysilicon layer, to activate dopants and make the gates 204a and 204b conductive.

Doped source/drain regions 206 are formed on the sides of the polysilicon gates 204a and 204b to define the channel areas of the above field effect transistors. A lightly doped drain (LDD) 206 is normally used in a MOS transistor in a memory or logic device area. The steps of forming a LDD 206 start with performing a light ion implantation on the self-aligned polysilicon gates 204a and 204b, and then depositing a chemical vapor deposition (CVD) oxide layer over the polysilicon gates 204a and 204b. Then an anisotropic etching back process is carried out on the oxide layer to expose the substrate above the LDD 206 and form oxide spacers 208 on the sides of the polysilicon gates 204a and 204b. A heavy ion implantation is then performed to form the source/drain regions 206.

Since the resistance of the polysilicon reduces the reliability of transmitted signals and increases the RC relay, even though the polysilicon layer in a semiconductor device of a narrow line width is heavily doped, the resistance of the heavily doped polysilicon layer is still too high. A salicide process is designed to reduce the resistance of a polysilicon gate, and the most common material used in a salicide process is titanium silicide.

Figure 2B:
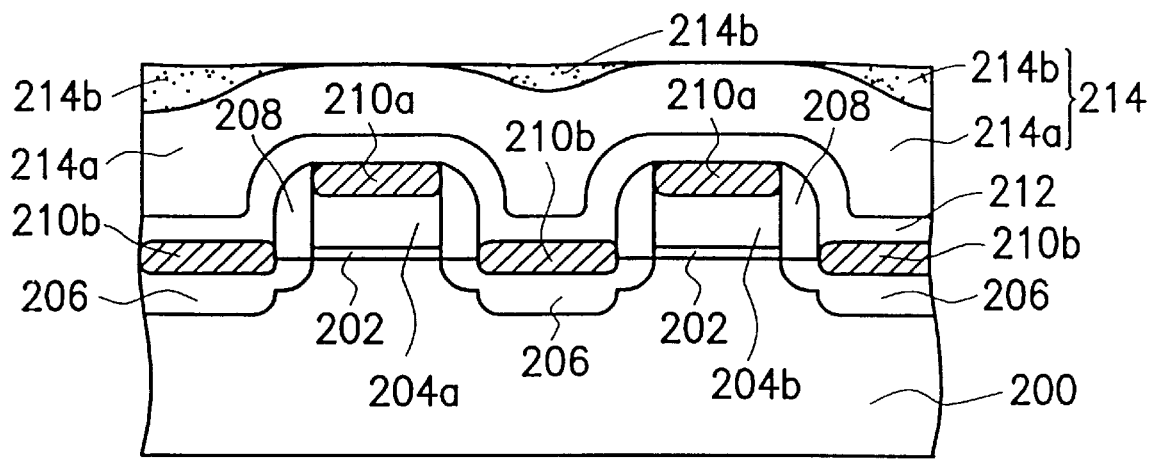

Referring to FIG. 2B. an ILD layer 214 is formed on the substrate 200. The steps of forming the ILD layer 214 include forming an ILD layer 214a, such as BPSG, silicon dioxide with boron and phosphorus, by performing atmospheric pressure chemical vapor deposition (APCVD) at a temperature of about 400° C., and forming a SOG layer 214b on the BPSG layer 214a. Because BPSG contains boron and phosphorus, and is formed by performing an APCVD process, the mechanical stress within the BPSG is lower than that of silicon dioxide. Furthermore, the temperature needed by BPSG to maintain a liquid state is lower, so, it is used as planarization dielectric. The SOG layer 214b is used for obtaining a planar surface over the substrate 200. Then, an etching back process is proceeded to remove undesired SO from the BPSG layer 214a, so that only the dishing locations on the surface of BPSG layer 214a are filled with SOG. The process of removing the undesired SOG includes a dry etching process that uses CF4, CHF3, or other fluoride gas, and oxygen as reactants.

Figure 2C:
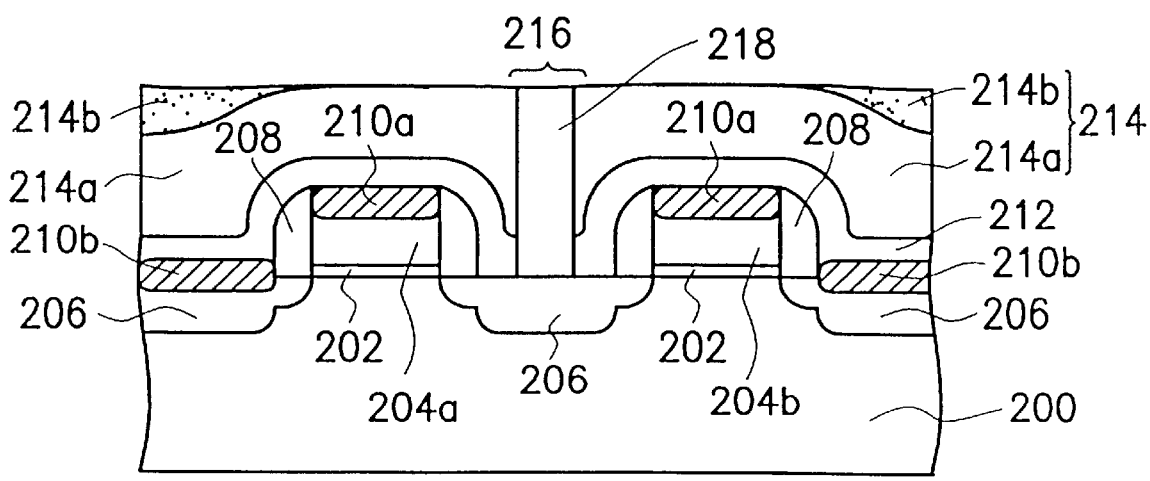

Even though salicide layers 210a and 210b will be damaged and causes further junction leakage if the ILD layer 214 is exposed under a high-temperature, nevertheless, a short-duration thermal treatment, such as a rapid thermal process (RTP), is still required to prevent the ILD layer 214 from cracking. The ILD layer 214 is then made denser after the short-duration thermal treatment. The denser ILD layer is more resistant to the etchants, so that cracking in the ILD layer 214 is avoided. The metal layer 218 is then formed, filling the contact hole 216 and electrically connecting to the source/drain regions 206 without forming bridges, as shown in FIG. 2C.

The invention includes a short-duration thermal treatment after the formation of the ILD layer, to increase the density of the ILD layer, so that the ILD layer is more resistant to etchants. Since cracking in the ILD layer caused by etchants is prevented, the metal layer filling the contact hole can not longer forms bridges, and as a result, the device is more reliable.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A method for fabricating a crack resistant inter-layer dielectric on a substrate for a salicide process, wherein the substrate comprises a gate, source/drain regions beside the gate, and a salicide layer on the gate and the source/drain regions, the method comprising:

forming a salicide layer on the gate and the source/drain regions;

forming an insulating layer over the substrate for covering the gate and the source/drain regions;

forming a dielectric layer on the insulating layer;

forming a spin-on glass layer on the dielectric layer;

etching back the spin-on glass layer using the dielectric layer as an etching stop layer, wherein a remaining spin-on glass layer and the dielectric layer together form a planarized inter-layer dielectric layer;

forming a contact opening in the inter-layer dielectric layer for exposing the source/drain regions;

performing a short-time thermal treatment to increase the density of the planarized inter-layer dielectric layer; and filling the contact opening after the short-time thermal treatment.

2. The method of claim 1, wherein the short-time thermal treatment includes a rapid thermal process.

3. The method of claim 1, wherein the insulating layer includes non-doped oxide.

4. The method of claim 1, wherein the insulating layer includes an oxide layer formed through atmospheric pressure chemical vapor deposition.

5. The method of claim 1, wherein the dielectric layer includes a doped oxide layer.

6. The method of claim 1, wherein the dielectric layer includes borophosphosilicate glass.

* * * * *